United States Patent
Lee et al.

[11] Patent Number: 6,015,733
[45] Date of Patent: Jan. 18, 2000

[54] PROCESS TO FORM A CROWN CAPACITOR STRUCTURE FOR A DYNAMIC RANDOM ACCESS MEMORY CELL

[75] Inventors: Yu-Hua Lee, Hsinchu; James (Cheng-Ming) Wu, Kao-Hsiung, both of Taiwan

[73] Assignee: Taiwan Semiconductor Manufacturing Company, Hsin-Chu, Taiwan

[21] Appl. No.: 09/133,356

[22] Filed: Aug. 13, 1998

[51] Int. Cl.⁷ .................................................. H01L 21/8242
[52] U.S. Cl. ............................................. 438/253; 438/970
[58] Field of Search ........................................ 438/253, 256, 438/396, 399, 634, 970, 976

[56] References Cited

U.S. PATENT DOCUMENTS

| | | | |
|---|---|---|---|
| 5,275,972 | 1/1994 | Ogawa et al. | 438/970 |
| 5,362,666 | 11/1994 | Dennison | 438/970 |
| 5,418,180 | 5/1995 | Brown | 437/60 |
| 5,597,755 | 1/1997 | Ajika et al. | 437/52 |
| 5,608,247 | 3/1997 | Brown | 257/306 |
| 5,629,539 | 5/1997 | Aoki et al. | 257/306 |
| 5,659,191 | 8/1997 | Arima | 257/296 |
| 5,753,547 | 5/1998 | Ying | 438/253 |
| 5,940,713 | 8/1999 | Green | 438/253 |

*Primary Examiner*—Chandra Chaudhari
*Attorney, Agent, or Firm*—George O. Saile; Stephen B. Ackerman

[57] ABSTRACT

A process for forming a crown shaped, polysilicon storage node structure, for a DRAM capacitor structure, has been developed. The process features the deposition of a polysilicon layer, on the top surface of a thick insulator layer, as well as on all surfaces of an opening, in the thick insulator layer. Removal of the regions of polysilicon, residing on the top surface of the thick insulator layer, results in a crown shaped, polysilicon storage node structure, in the opening, in the thick insulator layer. The crown shaped, polysilicon storage node structure, was protected from the polysilicon removal procedure, by a photoresist plug, formed overlying the polysilicon layer, in the opening, in the thick insulator layer. The photoresist plug was formed via photoresist application, exposure, and the development of exposed photoresist regions.

22 Claims, 5 Drawing Sheets

6,015,733

PROCESS TO FORM A CROWN CAPACITOR STRUCTURE FOR A DYNAMIC RANDOM ACCESS MEMORY CELL

BACKGROUND OF THE INVENTION (1) Field of the Invention

The present invention relates to fabrication processes used to create a dynamic random access memory, (DRAM), device, on a semiconductor substrate, and more specifically, relates to a process used to create a crown shaped, storage node structure, for the DRAM device.

(2) Description of Prior Art

Cylindrical shaped, or crown shaped, capacitor structures, have been used to increase the surface area of DRAM capacitors, and thus increase the signal or performance of DRAM devices. Stacked capacitor structures, (STC), located overlying the transfer gate transistor, of the DRAM device, are limited by the dimensions of the underlying transfer gate transistor. Therefore to increase the surface area of the STC structure, without infringing on neighboring, underlying transfer gate transistors, specific STC shapes are employed. For example, a crown shaped, storage node structure, comprised of vertical polysilicon features, connected to an underlying horizontal polysilicon feature, offers increased storage node surface area, when compared to counterparts, fabricated without vertical polysilicon features, or without the use of the crown shape. The use of the crown shaped, STC structure, however results in a process difficulties when creating the crown shaped, storage node structure. For example after creating an opening, in a thick insulator layer, a polysilicon layer is deposited, on the top surface of the thick insulator layer, as well as on the surfaces of the thick insulator layer, exposed in the opening. Removal of the polysilicon layer, from the top surface of the thick insulator layer, results in a crown shaped, polysilicon structure, comprised of vertical polysilicon features, on the sides of the opening in the thick insulator layer, connected to a horizontal polysilicon feature, residing at the bottom of the opening in the thick insulator layer. However difficulties can occur during the removal of polysilicon, from the top surface of the thick insulator layer, specifically, redeposition of material on, or damage to, the resulting crown shaped, polysilicon structure, residing in the opening in the thick insulator layer.

A method used to alleviate the difficulties of polysilicon removal, in the presence of the crown shaped, polysilicon structure, is to protect the crown shaped, polysilicon structure, located in the opening in the thick insulator layer, via filling the opening with either spin on glass, (SOG), or photoresist, than removing these fill layers, after removal of unprotected polysilicon, located on the top surface of the thick insulator layer. Ying, in U.S. Pat. No. 5,753,547, describes a SOG fill, as a protective fill, during the crown shaped, polysilicon definition procedure, however the additional cost of depositing SOG, and then planarizing it back, via plasma etch procedures, to expose polysilicon, is not attractive. Ajika et al, in U.S. Pat. No. 5,597,755, teach a photoresist fill, for protection of the crown shaped structure, during the polysilicon removal process. However this patent also employs a costly etch back procedure to expose the polysilicon to be removed. This invention will also describe a procedure in which a photoresist plug will be used as protection for the subsequent crown shaped, polysilicon structure, during removal of polysilicon from the top surface of a thick insulator layer. However unlike the prior art, the photoresist plug is planarized using a novel photoresist exposure—development procedure, avoiding the costly plasma etch back procedure.

SUMMARY OF THE INVENTION

It is an object of this invention to create a crown shaped, polysilicon storage node structure, for a DRAM, stacked capacitor structure.

It is another object of this invention to protect the crown shaped, polysilicon structure, with a photoresist plug, during the removal of unwanted regions of polysilicon.

It is still yet another object of this invention to form the photoresist plug, used for protection of a crown shaped, polysilicon structure, during a polysilicon etch back procedure, via photolithographic exposure and development procedures.

In accordance with the present invention a process for forming a crown shaped, capacitor structure, for a DRAM device, in which a photoresist plug is used to protect a crown shaped, polysilicon storage node shape, during an etch back procedure used to remove unwanted regions of polysilicon, is described. After the creation of a transfer gate transistor, a storage node contact hole is opened in a composite insulator layer, exposing the top surface of source region, of the transfer gate transistors. A doped polysilicon plug is next formed in the storage node contact hole. An insulator layer is deposited and patterned, to form an opening in the insulator layer, exposing the top surface of the doped polysilicon plug. A layer of polysilicon is next deposited, on the top surface of the insulator layer, as well as on all surfaces of the opening in the insulator layer. A photoresist layer is applied, followed by an exposure and development procedure, resulting in the creation of a photoresist plug, overlying the regions of the polysilicon layer, residing on the surfaces of the opening in the insulator layer, while the regions of polysilicon, on the top surface of the insulator, are left unprotected. A plasma etch back procedure, is used to remove unprotected regions of the polysilicon layer, resulting in a crown shaped, polysilicon storage node structure, underlying the photoresist plug, in the opening in the insulator layer. Removal of the photoresist plug, and removal of the insulator layer, results in the crown shaped, polysilicon storage node structure, overlying the composite insulator layer, and overlying and contacting, the doped polysilicon plug, located in the storage node contact hole. A capacitor dielectric layer is next formed on the crown shaped, polysilicon storage structure, followed by the deposition, and patterning of a polysilicon layer, creating an upper polysilicon electrode, for the DRAM capacitor structure, featuring the crown shaped, polysilicon storage node structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for forming a crown shaped, polysilicon storage node structure, for a DRAM capacitor structure, featuring the use of a photoresist plug, used to protect the crown shaped, polysilicon storage node structure, during a procedure used to remove unwanted regions of polysilicon, will now be described in detail. The creation of the DRAM, transfer gate transistor, is first addressed, and shown schematically in FIG. 1. A semiconductor substrate 1, comprised of P type, single crystalline silicon, having a <100>, crystallographic orientation, is used. A gate insulator 2, comprised of silicon dioxide, obtained via thermal oxidation procedures, to a thickness between about 50 to 200 Angstroms, is next grown. A polysilicon layer 3, is next deposited using low pressure chemical vapor deposition, (LPCVD), to a thickness between about 1500 to 4000 Angstroms. The polysilicon layer can be grown using in situ doping procedures, or grown intrinsically and doped via ion implantation procedures. If desired polysilicon layer 3, can be replaced by a polycide, (metal silicide on polysilicon), layer. This can be accomplished via an LPCVD procedure, used to deposit a thin polysilicon layer, followed by the deposition of an overlying metal silicide layer, such as tungsten silicide. Polycide layers offer lower resistance than polysilicon counterparts, thus resulting in performance enhancements. An insulator layer 4, comprised of silicon oxide, or silicon nitride, is next deposited via LPCVD, or plasma enhanced chemical vapor deposition, (PECVD), procedures, at a thickness between about 500 to 2000 Angstroms. Conventional photolithographic and anisotropic RIE procedures, using $CHF_3$ as an etchant for insulator layer 4, and using $Cl_2$ as an etchant for polysilicon layer 3, are used to create the polysilicon gate structure, shown schematically in FIG. 1. The photoresist shape, used as a mask for polysilicon gate structure patterning, is removed using plasma oxygen ashing and careful wet cleans.

Figure 1:
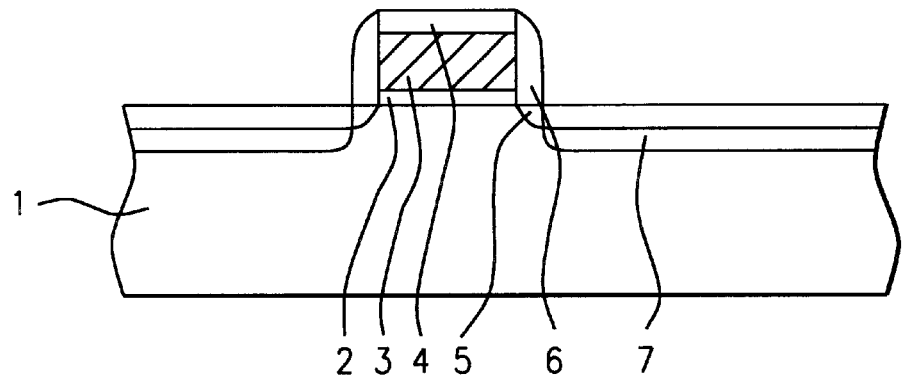
FIGS. 1–10, which schematically, in cross-sectional style, show the creation the crown shaped, polysilicon storage node structure, used for a DRAM capacitor structure, in which a photoresist plug is used to protect the crown shaped, polysilicon storage node structure, during removal of unwanted regions of polysilicon.

Lightly doped, N type source/drain region 5, is next created via ion implantation of arsenic or phosphorous, at an energy between about 15 to 35 KeV, at a dose between about 1E14 to 1E15 atoms/cm$^2$. Insulator spacers 6, are formed by initially depositing a layer of silicon oxide, using LPCVD or PECVD procedures, to a thickness between about 1000 to 3000 Angstroms, followed by an anisotropic RIE procedure, using $CHF_3$ as an etchant. Insulator spacers 6, can also be comprised of silicon nitride. Heavily doped, N type source and drain region 7, shown schematically in FIG. 1, is next formed via ion implantation of either arsenic or phosphorous, at an energy between about 30 to 50 KeV, at a dose between about 1E15 to 1E16 atoms/cm$^2$.

Figure 2:
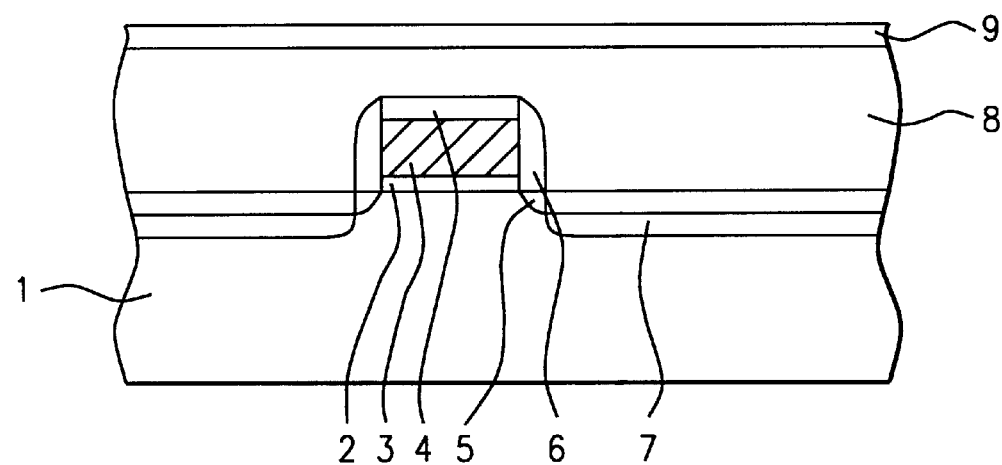

A composite insulator layer, comprised of an underlying silicon oxide layer 8, and an overlying silicon nitride layer 9, is next deposited. Silicon oxide layer 8, is first deposited, via LPCVD or PECVD procedures, to a thickness between about 5000 to 8000 Angstroms. A planarization procedure, performed using chemical mechanical polishing, is employed to create a smooth top surface topography for silicon oxide layer 8. Next silicon nitride layer 9, shown schematically in FIG. 2, is deposited, via LPCVD or PECVD procedures, to a thickness between about 200 to 700 Angstroms.

Figure 3:
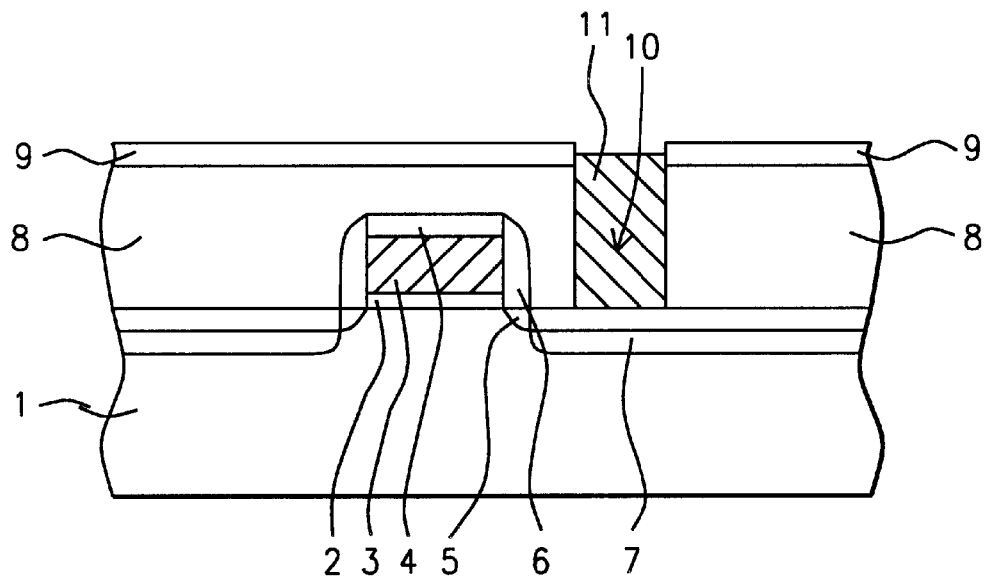

The creation of doped polysilicon plug structure 11, is next addressed, and described using FIG. 3. Photolithographic and RIE procedures, using $CF_4$—$SF_6$ as an etchant for first silicon nitride layer 9, and using $CHF_3$ as an etchant for silicon oxide layer 8, are employed to open storage node contact hole 10, using a photoresist shape, (not shown), as an etch mask. Storage node contact hole 10, shown schematically in FIG. 3, exposes the top surface of a heavily doped, N type source/drain region 7. After removal of the photoresist shape, used for definition of storage node contact hole 10, via plasma oxygen ashing and careful wet cleans, a polysilicon layer is deposited using LPCVD procedures, to a thickness between about 1800 to 3000 Angstroms, completely filling storage node contact hole 10. The polysilicon layer can be deposited using in situ doping procedures, via the addition of either phosphine or arsine, to a silane source, or the polysilicon layer can be deposited intrinsically, and doped via ion implantation procedures, using either arsenic or phosphorous. Removal of the polysilicon layer, from the top surface of silicon nitride layer 9, via an anisotropic RIE procedure, using $Cl_2$ as an etchant, or via a chemical mechanical polishing procedure, results in the formation of doped polysilicon plug 11, located in storage node contact holes 10, contacting heavily doped, N type source/drain region 7. In order to insure complete removal of polysilicon, from the top surface of silicon nitride layer 9, an over etch cycle is employed, resulting in the recessing of doped polysilicon plug 11, in storage node contact hole 10. This is schematically shown in FIG. 3.

Figure 4:
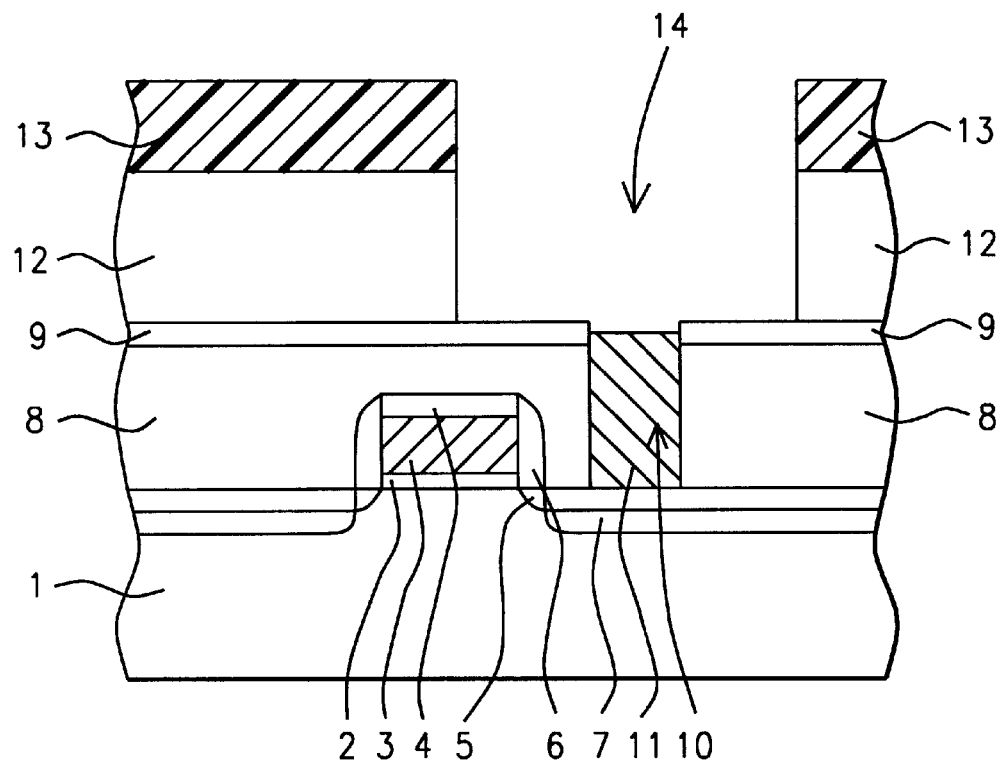
Figure 5:
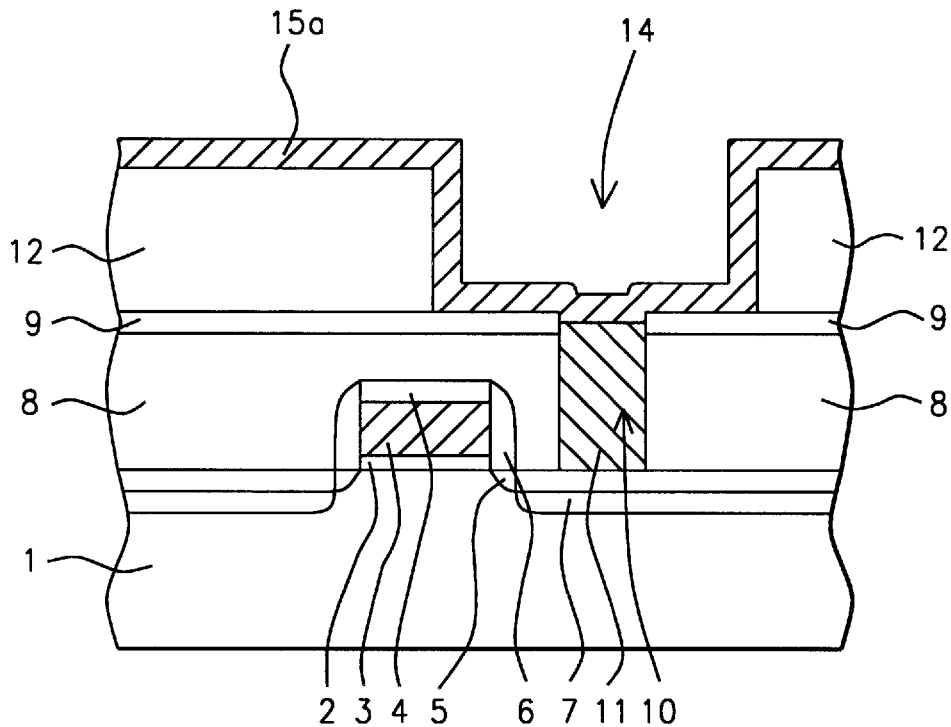

The formation of the shape, needed to create the crown shaped, polysilicon storage node structure, is next addressed, and described in FIG. 4. An insulator layer 12, comprised of silicon oxide, is deposited using LPCVD or PECVD procedures, to a thickness between about 5000 to 15000 Angstroms, using tetraethylorthosilicate, (TEOS), as a source. Photoresist shape 13, is next formed on underlying insulator layer 12, and used as a mask, to allow an anisotropic RIE procedure, using $CHF_3$ as an etchant, to create opening 14, in insulator layer 12. The top surface of doped polysilicon plug 11, as well as a portion of the top surface of silicon nitride layer 9, are exposed in opening 14. After removal of photoresist shape 13, via plasma oxygen ashing and careful wet cleans, polysilicon layer 15a, is deposited, via LPCVD procedures, to a thickness between about 1000 to 3000 Angstroms. Polysilicon layer 15a, shown schematically in FIG. 5, can be doped in situ, during deposition, via the addition of arsine, or phosphine, to a silane ambient, or polysilicon layer 15a, can be deposited intrinsically, and doped via ion implantation procedures, using arsenic or phosphorous ions. Polysilicon layer 15a, shown schematically in FIG. 5, overlays the top surface of insulator layer 12, in addition to coating the sides of insulator layer 12, exposed in opening 14. Polysilicon layer 15a, also overlies and contacts, the top surface of doped polysilicon plug 11, at the bottom of opening 14.

Figure 6:
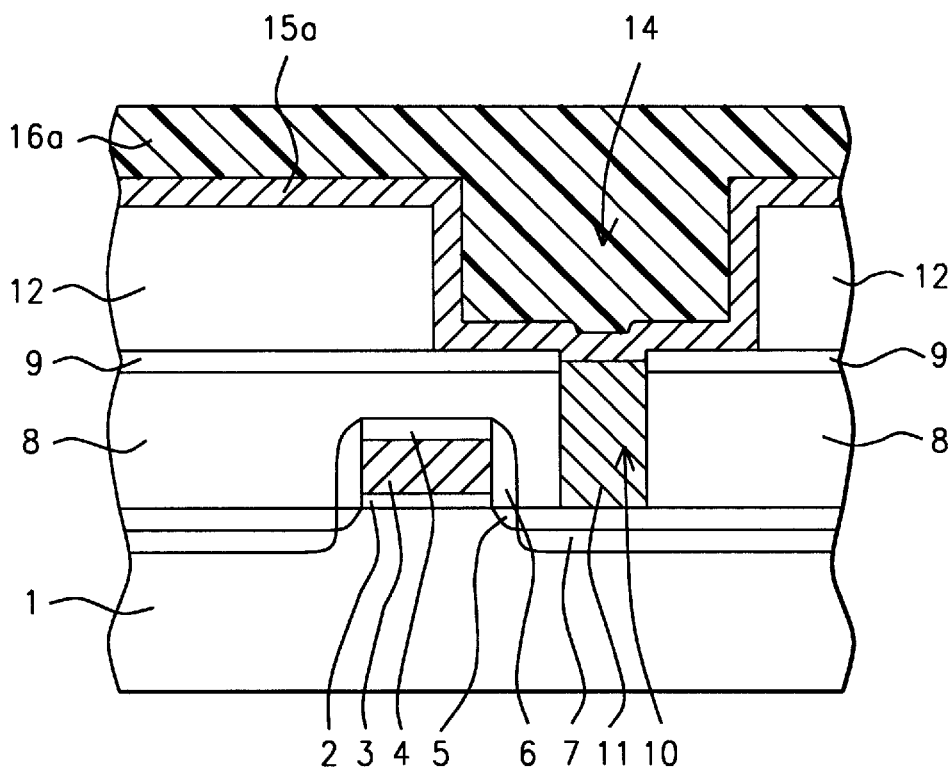
Figure 7:
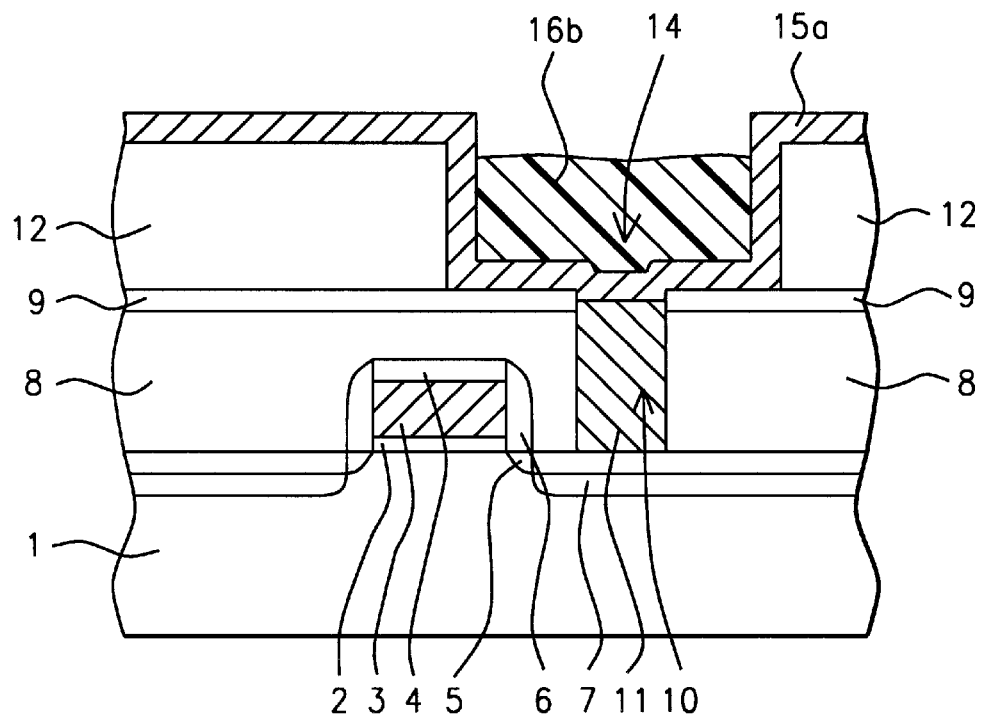

The method to remove unwanted regions of polysilicon layer 15a, from the top surface of insulator 12, creating crown shaped, polysilicon storage node structure 15b, is next addressed, and described schematically, in FIGS. 6–9. First a photoresist layer 16a, is applied, at a thickness between about 10000 to 20000 Angstroms, covering the top surface of insulator layer 12, and completely filling opening 14. This is schematically shown in FIG. 6. Next photoresist layer 16a, is subjected to a blanket exposure, at a dose between about 20 to 40 millijoules, followed by development of the exposed photoresist layer 16a, using a standard developer, for a time between about 2 to 4 mins. This development procedure, results in removal of the exposed portion of photoresist layer 16a, leaving photoresist plug 16b, between about 3000 to 13000 Angstroms in thickness, remaining in opening 14. This is schematically shown in FIG. 7. If desired, another iteration is to form photoresist plug 16b, without the exposure procedure, using a longer development cycle, between about 4 to 6 mins., for removal of the top portion of photoresist layer 16a. Photoresist plug 16b, overlays the portion of polysilicon layer 15a, that will be used to form the crown shaped, polysilicon storage node structure.

Figure 8:
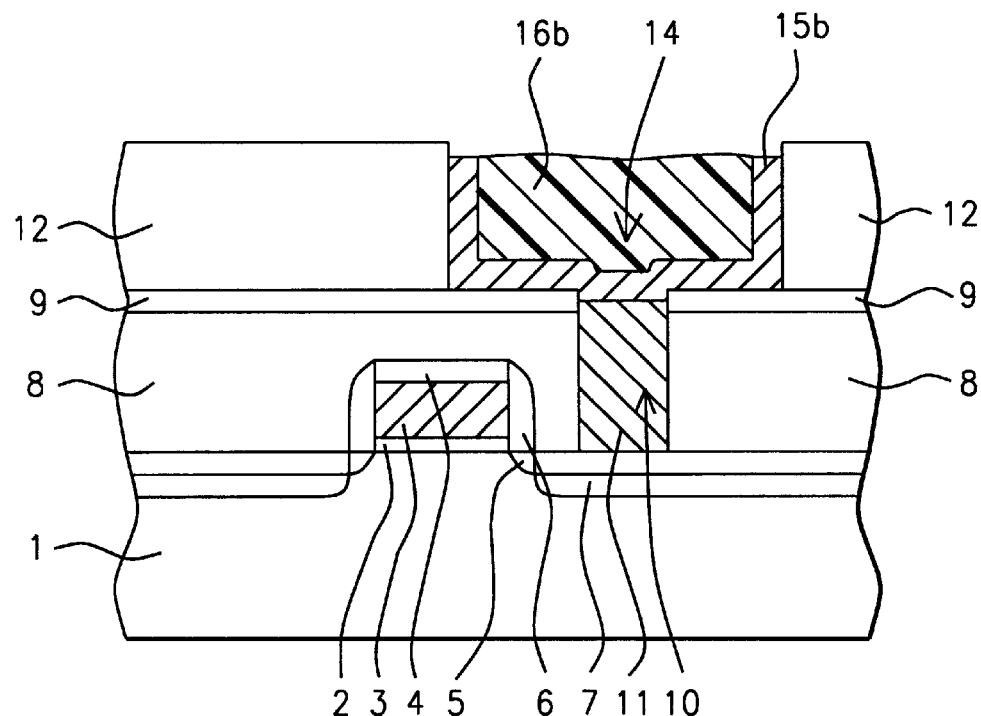
Figure 9:
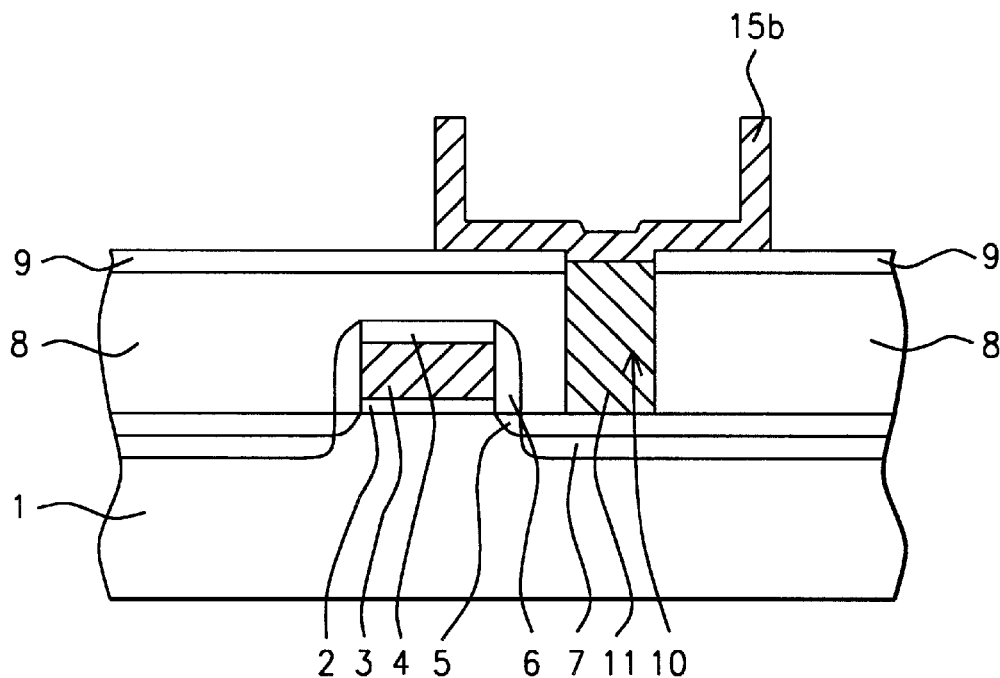

Removal of exposed regions of polysilicon layer 15a, is next performed using an etch back procedure, comprised of an anisotropic RIE procedure, using Cl$_2$ as an etchant. Another alternative is to remove the exposed portions of polysilicon layer 15a, via a chemical mechanical polishing, (CMP), procedure. Both procedures result in the creation of crown shaped, polysilicon storage node structure 15b, protected from the removal procedures, by photoresist plug 16b. This is schematically shown in FIG. 8. Removal of photoresist plug 16b, is next accomplished using either a plasma oxygen ashing procedure, or a wet KOH procedure ???, followed by the removal of insulator layer 12, via use of a buffered hydrofluoric acid solution. Silicon nitride layer 9, provides the etch stop needed during the removal of silicon oxide layer 12, protecting underlying silicon oxide layer 8, as well as the underlying transfer gate transistor, during the removal procedure. Crown shaped, polysilicon storage node structures 15b, schematically shown in FIG. 9, overlies, and contacts the top surface of doped polysilicon plug 11.

The procedures described above, used to create a crown shaped, polysilicon structure, can also be used to create a crown shaped, storage node structure, in which a hemispherical grain, (HSG), silicon layer, is used for the top layer of the crown shaped, storage node structure. This can be accomplished via formation of an HSG silicon layer, on polysilicon layer 15a, or via selective formation of an HSG silicon layer, on crown shaped, polysilicon storage node structure 15b.

Figure 10:
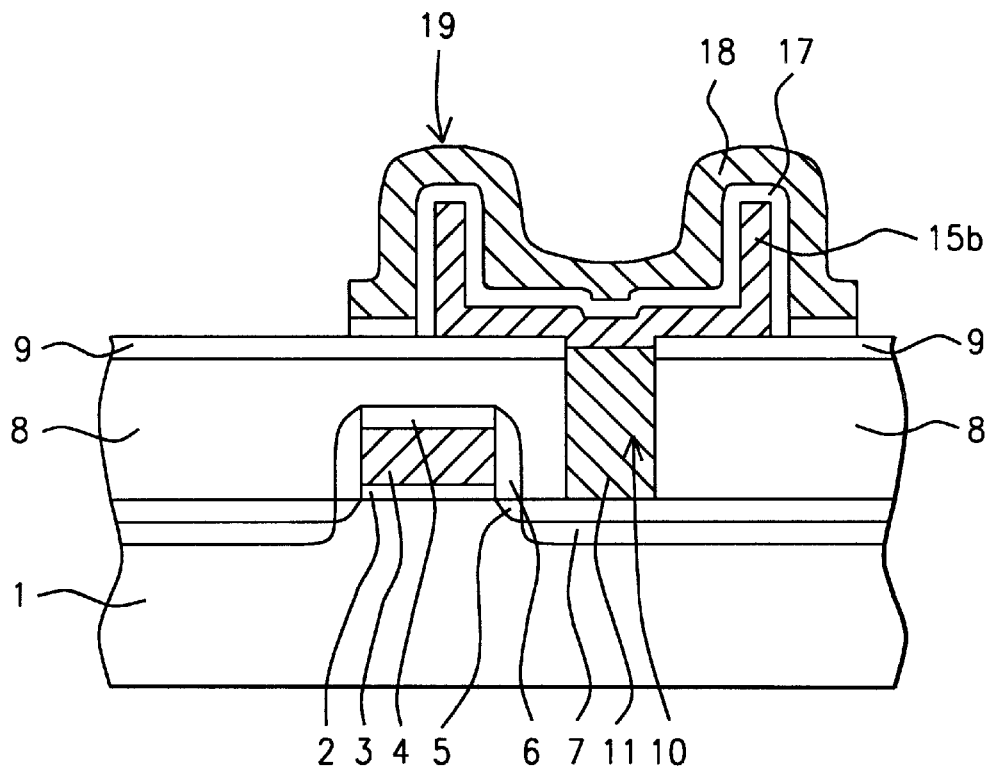

A capacitor dielectric layer 17 is next formed on the top surface of crown shaped, polysilicon storage node structure 15b. Capacitor dielectric layer 17, is a composite dielectric layer of silicon oxynitride—silicon nitride—silicon oxide, (ONO), at an equivalent silicon oxide thickness of between about 40 to 80 Angstroms. The ONO layer is created by initially creating a native, silicon oxide layer, between about 10 to 30 Angstroms in thickness, on the surface of crown shaped, polysilicon storage node structure 15b. A thin layer of silicon nitride is next deposited, using LPCVD procedures, to a thickness between about 30 to 50 Angstroms. An oxidation procedure, performed in an oxygen—steam ambient, is next used to convert the surface of the silicon nitride layer, to a silicon oxynitride layer, thus creating the ONO layer, overlying crown shaped, polysilicon storage node structures 15b. After creation of capacitor dielectric layer 17, another polysilicon layer, is deposited, via LPCVD procedures, to a thickness between about 500 to 2000 Angstroms. The polysilicon layer can be in situ doped, during deposition, via the addition of arsine, or phosphine, to a silane ambient, or the polysilicon layer, can be grown intrinsically and doped via ion implantation procedures, using arsenic or phosphorous. Patterning of the polysilicon layer is next performed, via conventional photolithographic and anisotropic RIE procedures, using Cl$_2$ as an etchant, creating polysilicon upper electrode 18, shown schematically in FIG. 10, and completing the formation of DRAM capacitor structure 19, comprised of polysilicon upper electrode 18, on capacitor dielectric layer 17, and underlying crown shaped, polysilicon storage node structure 15b.

While this invention has been particularly shown and described with reference to the preferred embodiments thereof, it will be understood by those skilled in the art that various changes in form and details may be made without departing from the spirit and scope of the invention.

What is claimed is:

1. A method of creating a capacitor structure, for dynamic random access memory (DRAM) devices, on a semiconductor substrate, comprising the steps of:

providing a transfer gate transistor, on said semiconductor substrate, comprised of a polysilicon gate structure, on a gate insulator layer, with a source/drain region, in a region of said semiconductor substrate, not covered by said polysilicon gate structure;

forming a storage node contact hole, in a composite insulator layer, exposing a source region, of said source/drain region;

forming a doped polysilicon plug, in said storage node contact hole, contacting said source region;

depositing a thick insulator layer;

forming an opening in said thick insulator layer, exposing the top surface of said doped polysilicon plug;

depositing a polysilicon layer, on the top surface of said thick insulator layer, on the surfaces of said thick insulator, exposed in said opening, and on the top surface of said doped polysilicon plug, exposed in the bottom of said opening, in said thick insulator layer;

forming a photoresist plug, in said opening, in said thick insulator layer, covering the portion of said polysilicon layer residing on the sides of, and on the bottom of, said opening, in said thick insulator layer;

removing the portion of said polysilicon layer, residing on the top surface of said thick insulator layer, creating a crown shaped, polysilicon layer, covered by said photoresist plug, in said opening, in said thick insulator layer;

removing said photoresist plug;

removing said thick insulator layer;

forming a capacitor dielectric layer on said crown shaped, polysilicon storage node structure; and forming a polysilicon upper electrode structure, on said capacitor dielectric layer.

2. The method of claim 1, wherein said composite insulator layer is comprised of an underlying silicon oxide layer, obtained via LPCVD or PECVD procedures, to a thickness between about 5000 to 8000 Angstroms, and an overlying silicon nitride layer, obtained via LPCVD or PECVD procedures, to a thickness between about 200 to 700 Angstroms.

3. The method of claim 1, wherein said doped polysilicon plug is created from a polysilicon layer, obtained via LPCVD procedures, at a thickness between about 1800 to 3000 Angstroms, and either doped in situ, during deposition, via the addition of either arsine or phosphine, to a silane ambient, or the polysilicon layer is deposited intrinsically, and doped via ion implantation of arsenic or phosphorous ions.

4. The method of claim 1, wherein said thick insulator layer is a silicon oxide layer, obtained via LPCVD or PECVD procedures, to a thickness between about 5000 to 15000 Angstroms, using TEOS as a source.

5. The method of claim 1, wherein said opening, in said thick insulator layer, is formed via an anisotropic RIE procedure, using CHF$_3$ as an etchant.

6. The method of claim 1, wherein said polysilicon layer is deposited via LPCVD procedures, to a thickness between about 1000 to 3000 Angstroms, and doped in situ, during deposition, via the addition of arsine or phosphine, to a silane ambient, or grown intrinsically, and doped via an ion implantation procedure, using arsenic or phosphorous ions.

7. The method of claim 1, wherein said photoresist plug is between about 3000 to 13000 Angstroms, in thickness, formed from a photoresist layer, applied at a thickness between about 10000 to 20000 Angstroms, blanket exposed at a dose between about 20 to 40 millijoules, and developed in a standard developer solution, for a time between about 2 to 4 mins.

8. The method of claim 1, wherein said crown shaped, polysilicon storage node structure, is formed via removal of said polysilicon layer, from the top surface of said thick insulator layer, via an anisotropic RIE procedure, using $Cl_2$ as an etchant, or via a chemical mechanical polishing procedure.

9. The method of claim 1, wherein said photoresist plug is removed via a plasma oxygen ashing procedure, or via a wet removal procedure, using a standard developer solution.

10. The method of claim 1, wherein said thick insulator layer is removed using a buffered hydrofluoric acid solution.

11. The method of claim 1, wherein said capacitor dielectric layer is a silicon oxynitride—silicon nitride—silicon oxide layer, (ONO), at an equivalent silicon dioxide thickness between about 40 to 80 Angstroms, created by an initial thermal oxidation to form a silicon oxide layer, between about 10 to 30 Angstroms, followed by a deposition of silicon nitride, to a thickness between about 30 to 50 Angstroms, and thermal oxidation of said silicon nitride layer, creating a silicon oxynitride layer, on the underlying, said silicon oxide layer.

12. A method for fabricating a crown shaped, polysilicon storage node structure, for a DRAM device, on a semiconductor substrate, wherein a photoresist plug is used to protect said crown shaped, polysilicon storage node structure, during a patterning procedure used to remove regions of a polysilicon layer, comprising the steps of:

providing a transfer gate transistor, comprised of a polysilicon gate structure, on a gate insulator layer, with a source/drain region, in a region of said semiconductor substrate, not covered by said polysilicon gate structure;

providing a storage node contact hole, in a composite insulator layer, exposing a source region, of said source/drain region, located at the bottom of said storage node contact hole;

forming a doped polysilicon plug, in said storage node contact hole;

depositing a thick silicon oxide layer;

forming an opening in said thick silicon oxide layer, exposing the top surface of said doped polysilicon plug;

depositing a polysilicon layer;

applying a photoresist layer, covering a first region of said polysilicon layer, where said polysilicon layer resides on the top surface of said thick silicon oxide layer, and completely filling said opening, in said thick silicon oxide layer, covering a second region of said polysilicon layer, where said polysilicon layer resides on the sides, and on the bottom, of said opening, in said thick silicon oxide layer;

exposing the top portion of said photoresist layer, resulting in an exposed photoresist layer overlying said first region of said polysilicon layer, and resulting in an unexposed, bottom portion of said photoresist layer, located overlying said second region of said polysilicon layer, in said opening, in said thick silicon oxide layer, unexposed;

removing said exposed photoresist layer, exposing said first region of said polysilicon layer, and resulting in a photoresist plug, comprised of said unexposed, bottom portion of photoresist layer, located on said second region of said polysilicon layer, in said opening, in said thick silicon oxide layer;

removing said first region of said polysilicon layer, from the top surface of said thick silicon oxide layer, resulting in said crown shape, polysilicon storage node structure, comprised of said second region of said polysilicon layer, underlying said photoresist plug, in said opening, in said thick silicon oxide layer;

removing said photoresist plug;

removing said thick silicon oxide layer;

forming a capacitor dielectric layer, on each said crown shaped, polysilicon storage node structure; and forming a polysilicon upper electrode, on said capacitor dielectric layer.

13. The method of claim 12, wherein said doped polysilicon plug is formed from a polysilicon layer, deposited using an LPCVD procedure, at a thickness between about 1800 to 3000 Angstroms, and doped in situ, during deposition, via the addition of arsine or phosphine, to a silane ambient, or deposited intrinsically, and doped via ion implantation of arsenic or phosphorous ions.

14. The method of claim 12, wherein said thick silicon oxide layer is deposited using LPCVD or PECVD procedures, to a thickness between about 5000 to 15000 Angstroms.

15. The method of claim 12, wherein said opening, in said thick silicon oxide layer, is created via an anisotropic RIE procedure, using $CHF_3$ as an etchant.

16. The method of claim 12, wherein said polysilicon layer is deposited using LPCVD procedures, to a thickness between about 1000 to 3000 Angstroms, and doped either during deposition, via an in situ doping procedure, via the addition of arsine, or phosphine, to a silane ambient, or deposited intrinsically and doped via ion implantation of arsenic or phosphorous ions.

17. The method of claim 12, wherein said photoresist layer is applied at a thickness between about 10000 to 20000 Angstroms.

18. The method of claim 12, wherein said photoresist plug is formed at a thickness between about 3000 to 13000 Angstroms, via exposure of said photoresist layer, at a dose between about 20 to 40 millijoules, followed by the removal of the exposed region of said photoresist layer, in a standard developer solution, for a time between about 2 to 4 mins.

19. The method of claim 12, wherein said first region of said polysilicon layer, is removed via an anisotropic RIE procedure, using $Cl_2$ as an etchant, or via a CMP procedure.

20. The method of claim 12, wherein said photoresist plug is removed via a plasma oxygen ashing procedure, or via use of a wet procedure, using a standard developer solution.

21. The method of claim 12, wherein said thick silicon oxide layer is removed using a buffered hydrofluoric acid solution.

22. The method of claim 12, wherein said capacitor dielectric layer is a silicon oxynitride—silicon nitride—silicon oxide, (ONO), layer, at an equivalent silicon oxide thickness between about 40 to 80 Angstroms, created by an initial thermal oxidation to form a silicon oxide layer, between about 10 to 30 Angstroms, followed by a deposition of silicon nitride, to a thickness between 30 to 50 Angstroms, and thermal oxidation of said silicon nitride layer, creating a silicon oxynitride layer on the underlying said silicon oxide layer.

* * * * *